United States Patent
Oswald et al.

(10) Patent No.: US 7,199,636 B2
(45) Date of Patent: Apr. 3, 2007

(54) ACTIVE DIODE

(75) Inventors: Richard K. Oswald, San Jose, CA (US); Tamotsu Yamamoto, Cupertino, CA (US); Takashi Ryu, Kyoto (JP); Hideki Shirokoshi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 11/094,369

(22) Filed: Mar. 31, 2005

(65) Prior Publication Data

US 2005/0218964 A1 Oct. 6, 2005

Related U.S. Application Data

(60) Provisional application No. 60/557,694, filed on Mar. 31, 2004.

(51) Int. Cl.
*H03L 5/00* (2006.01)
(52) U.S. Cl. .................................. 327/325; 327/313
(58) Field of Classification Search ................ 327/309, 327/313–314, 320–321, 325–326, 427, 434, 327/437
See application file for complete search history.

(56) References Cited

U.S. PATENT DOCUMENTS

| | | | |
|---|---|---|---|
| 4,378,530 A | 3/1983 | Garde | |
| 4,727,308 A | 2/1988 | Huljak et al. | |
| 4,943,902 A | 7/1990 | Severinsky | |
| 4,959,606 A | 9/1990 | Forge | |
| 5,305,192 A | 4/1994 | Bonte et al. | |
| 5,420,530 A | 5/1995 | Mita | |
| 5,420,532 A | 5/1995 | Teggatz et al. | |
| 5,479,090 A | 12/1995 | Schultz | |
| 5,600,234 A | 2/1997 | Hastings et al. | |
| 5,903,447 A | 5/1999 | Takahashi et al. | |
| 5,905,407 A | 5/1999 | Midya | |
| 5,929,620 A | 7/1999 | Dobkin et al. | |
| 5,949,229 A | 9/1999 | Choi et al. | |
| 5,982,160 A | 11/1999 | Walters et al. | |
| 5,991,182 A | 11/1999 | Novac et al. | |
| 6,034,517 A | 3/2000 | Schenkel | |
| 6,046,516 A * | 4/2000 | Maier et al. | 307/125 |
| 6,066,943 A | 5/2000 | Hastings et al. | |
| 6,166,528 A | 12/2000 | Rossetti et al. | |
| 6,222,356 B1 | 4/2001 | Taghizadeh-Kaschani | |
| 6,268,756 B1 | 7/2001 | Nayebi et al. | |
| 6,307,356 B1 | 10/2001 | Dwelley | |

(Continued)

*Primary Examiner*—My-Trang Nu Ton
(74) *Attorney, Agent, or Firm*—McDermott Will & Emery LLP

(57) ABSTRACT

An active diode including a NMOS transistor having a source terminal, a drain terminal, a gate terminal and a back gate terminal, where the source terminal is connected to the back gate terminal and forms the anode terminal of the active diode, and the drain terminal forms the cathode terminal of the active diode. The active diode further includes an offset bias voltage source having a first terminal and a second terminal; and an amplifier having a non-inverting input terminal and an inverting input terminal, and an output terminal, where the inverting input terminal is connected to the drain terminal of the transistor, the non-inverting input terminal is connected to the first terminal of the offset bias source, the output terminal is connected to the gate terminal of the transistor, and the second terminal of the offset bias source is connected to the source terminal of the transistor.

23 Claims, 10 Drawing Sheets

U.S. PATENT DOCUMENTS

| | | |
|---|---|---|
| 6,313,610 B1 * | 11/2001 | Korsunsky ............... 320/134 |
| 6,366,070 B1 | 4/2002 | Cooke et al. |
| 6,404,261 B1 * | 6/2002 | Grover et al. ............. 327/320 |
| 6,476,589 B2 | 11/2002 | Umminger et al. |
| 6,498,466 B1 | 12/2002 | Edwards |
| 6,509,721 B1 | 1/2003 | Liebler |
| 6,522,178 B2 | 2/2003 | Dubhashi et al. |
| 6,541,947 B1 | 4/2003 | Dittmer et al. |
| 6,563,725 B2 | 5/2003 | Carsten |
| 6,611,131 B2 | 8/2003 | Edwards |
| 6,724,174 B1 | 4/2004 | Esteves et al. |
| 6,744,241 B2 | 6/2004 | Feldtkeller |
| 6,828,766 B2 | 12/2004 | Corva et al. |
| 6,873,140 B2 | 3/2005 | Saginni et al. |
| 6,894,471 B2 | 5/2005 | Corva et al. |
| 7,030,596 B1 | 4/2006 | Salerno et al. |
| 2003/0025484 A1 | 2/2003 | Edwards |

* cited by examiner

ACTIVE DIODE

CLAIM OF PRIORITY

This patent application, and any patent(s) issuing therefrom, claim priority from U.S. provisional patent application Ser. No. 60/557,694, filed on Mar. 31, 2004, which is incorporated herein by reference in its entirety.

FIELD OF THE INVENTION

The present invention generally relates to active diodes, and more particularly, to active diodes for use in, for example, rectifiers and switching regulators.

BACKGROUND OF THE INVENTION

The use of diodes for supplying power to electronic components in various types of devices is well known in the art. Some examples are rectifiers in AC to DC, or DC to DC conversion, ORing of two or more DC supplies for reliability or redundancy, and voltage clamping for inductive switching circuits including switching regulators.

In such applications, the function of the diode is to conduct current in the forward direction (from anode to cathode) with minimum voltage drop, and also to minimize current flow in the reverse direction ("leakage" current). To reduce the diode forward voltage drop, metal-semiconductor junction (Schottky) diodes are often used, but their forward voltage drops are still hundreds of millivolts and reverse currents may be unacceptably large, especially at higher reverse blocking voltages. Reducing the forward direction voltage and reverse (leakage) current is the predominant figure of merit for diodes in these applications.

To reduce the diode forward voltage drop, it is known in the art that the two terminal diode can be replaced by an active switching device such as a transistor. But the transistor is of course a three terminal device and the third control terminal must be driven with a signal suitable for the application. For many switching regulator applications, this control signal is just the logical complement of the control signal already used for the main switch, and its use creates a synchronous rectifier. By using this signal, the increase in circuit complexity is minimized.

For many other applications including some switching regulators, no control signal for the three terminal diode device is directly available, and sense circuits monitoring the voltages and currents at the anode and cathode terminals must be added to generate the control signal for the third terminal. When the sense circuits are included within a block having only two external terminals—anode and cathode (plus perhaps a power supply), an active diode is created which can generally be directly substituted for an ordinary diode but with improved characteristics.

Both bipolar junction transistors (BJTs) and metal oxide transistors (MOSFETs) have been utilized in known synchronous rectifier implementations. MOSFETs are typically preferable due to their fast switching speed, as faster switching time consequently leads to improved power efficiency. The BJT has the disadvantage of slow switching speed, especially during turn-off time due to the fact that the BJT has a storage time which increases with the depth of saturation. As such, the MOSFET can typically turn off faster due to the absence of such storage time.

Another reason MOSFETs are typically preferred is that MOSFETs are driven by voltage, and therefore do not require a continuous DC gate current but only a charge and discharge current. In contrast, the BJT requires a DC base current, which is typically supplied by the input voltage supply, rather than from the rectified current. Since one factor in reducing power consumption is to use the lowest possible supply current, this base current used for driving the BJT disadvantageously reduces the overall efficiency of the synchronous rectifier circuit.

In addition, in the saturation region, the base current of the BJT becomes very large due to low saturated current gain "β." In order to minimize this base current loss, a BJT usually operates in the active region. However, a relatively large voltage $V_{CE}$ is required between the collector and emitter for operating the BJT in this active region. This large $V_{CE}$ voltage leads to a large increase in the synchronous rectifier's forward voltage drop and a significant decrease in efficiency. Nonetheless, it is possible to reduce the $V_{CE}$ voltage across the collector-emitter junction, for example, by using a large area BJT device, but the drawback of this method is an increase in cost, size and circuit complexity, as well as the limitation of operating only in the saturation region. Hence, this conflict between operating in the saturation region, which yields low $V_{CE}$ but high base current, and in the active region, which allows low base current but high $V_{CE}$, becomes the key focus from the perspective of efficiency where a compromise for moderate efficiency is much needed.

One way to correct this problem is to operate the BJT in the quasi-saturation region, as is disclosed in U.S. Pat. No. 6,563,725 (the '725 patent). As described in the '725 patent, the voltage $V_{CE}$ across the collector-emitter junction is controlled in proportion to the current flowing through the transistor and load, thus establishing a partially ON $V_{CE}$ voltage and giving rise to only a moderate base current and large device area for the BJT.

FIG. 1(a) illustrates the schematic of the synchronous rectifier disclosed in the '725 patent, and FIG. 1(b) illustrates the various junctions formed by the BJT 102 of the synchronous rectifier disclosed in the patent. Referring to FIG. 1(a), the circuit comprises a BJT 102, transconductance amplifier 110 and offset voltage source 116. As shown, the output of amplifier 110 is coupled to the base terminal 108 of BJT 102. The collector terminal 106 of the BJT 102 serves as an anode. The emitter terminal 104 of the BJT 102 serves as a cathode terminal, and is coupled to the load through an inductor. The emitter and collector terminals of the BJT 102 are also coupled to the inverting input 112 and the non-inverting input 114 of the transconductance amplifier 110, respectively. The transconductance amplifier 110 functions to sense the collector-emitter voltage ($V_{CE}$) of BJT 102 and provide a base drive current ($I_B$) that is essentially proportional to the voltage difference between the positive and negative inputs of the amplifier 110. It is noted that the $V_{CE}$ at which $I_B=0$ is "offset" from $V_{CE}=0$ by a small positive offset voltage 116. As explained in the '725 patent, the offset is necessary to realize an optimal $I_B$ vs. $V_{CE}$ relationships over a broad range of BJT collector currents.

In operation, the BJT 102 is initially "off" when a forward voltage is first applied, but the relatively high $V_{CE}$ causes a high forward $I_B$ to flow, which provides a high base drive turn-on pulse until $V_{CE}$ falls to the operating level, i.e., a steady-state condition. This momentary forward voltage is analogous to the "forward recovery" voltage for a P-N junction diode.

During conduction, the proportionality between $I_B$ and $V_{CE}$ (including Voffset) provides the optimal base drive current for a given conduction current. The turn-off of BJT 102 is initiated by a reverse base current $I_B$ when the $V_{CE}$ falls below Voffset or reverses polarity.

In such a conventional synchronous rectification circuit 100, one potential problem is the emitter-base reverse-breakdown voltage $BV_{eb}$. During operation, the voltage of the cathode terminal changes from near ground GND to the (positive) supply voltage. As the emitter-base reverse-breakdown voltage $BV_{eb}$ is continually being reduced in the newer semiconductor technologies, it is likely that the emitter-base reverse-breakdown voltage $BV_{eb}$ will be exceeded as the voltage of the output terminal changes to the supply voltage level. As a result, it is possible that voltage device breakdown could occur even before a sufficient voltage level is supplied for operation of the circuit.

Another potential issue is the transient response of the transconductance amplifier 110. Since there is no diode or clamp circuit inserted between the cathode terminal 122 and anode terminal 124, when the current of the synchronous rectifier (SR) becomes forward direction, there is no current path until the transconductance amplifier 110 turns ON. Emitter-base junction of the BJT 102 makes a PN junction as shown in FIG. 1(b), but there is no current supply path to the base 108. As such, the voltage at the cathode terminal 122, or emitter 104, and the base 108 becomes substantially negative with respect to the collector 106 where the voltage can far exceed the value of an ordinary diode voltage. The value of this voltage could be, for example, 10 volts or more. As a result, this large voltage not only impairs power efficiency of the SR circuit but also has the capability to exceed the breakdown voltage of the base-collector junction.

Another known synchronous rectifier circuit is disclosed in U.S. Pat. No. 5,420,532 (the '532 patent). FIG. 2 depicts a schematic diagram of the synchronous rectifier circuit disclosed by the '532 patent, and FIG. 3 illustrates a timing chart associated with the operation of the circuit. The object of this circuit is to efficiently switch the inductive loads using energy conservation techniques including turning off a driving switch by recirculating residual load current and clamping the output so as to substantially decrease the power dissipation during inductive load turn-off.

In operation, the circuit 200 senses the voltage at the LX terminal 220 and controls the MOS transistor 204 in the following manner. Specifically, transistor 204 is controlled in two conditional states: ON and OFF. When the input SW 218 is at a voltage value greater than the MOS threshold above the voltage at 226, transistor 202 conducts and drives the inductive load 214. When the input SW 218 drops to approximately 0V, transistor 202 turns off. Since current cannot instantaneously change through an inductor, inductor 212 experiences a negative flyback according to the equation V=L*(di/dt). Therefore, the voltage at the LX terminal 220 begins to go negative due to the recirculation current $I_L$ 222, turning transistor 204 ON. Transistor 204 therefore begins conducting the recirculation current $I_L$ 222. Since transistor 204 only allows the voltage at the LX terminal 220 to fall to a certain voltage below ground, defined by its ON resistance $R_{ON}$ times the recirculation current $I_L$, where this voltage is significantly smaller than the forward voltage drop across a conventional diode, the power dissipation and therefore the power loss from inductor 212 current turn-off is significantly smaller.

Meanwhile, recirculation current $I_L$ 222 decreases according to the time constant of inductive load 212. The voltage at the LX terminal 220, which is determined by the ON resistance $R_{ON}$ times the recirculation current $I_L$, approaches the threshold voltage of circuit 200. As the voltage at the LX terminal 220 increases to greater than this threshold voltage, transistor 204 automatically turns OFF, causing the voltage at the LX terminal 220 to decrease again until a diode formed by the back gate and source becomes active. On the other hand, when the voltage at the LX terminal 220 becomes lower than the circuit threshold voltage, transistor 204 turns ON because the voltage across the diode formed by the back gate and source becomes high enough to turn transistor 204 ON again. Nevertheless, power loss can become very large at the transistor 204 while cycling this operation between exceeding above and decreasing below this threshold voltage repeatedly, and can result in oscillation, as shown in "Transistor204/Gate" signal of FIG. 3. Therefore, to avoid this undesired oscillation, additional control functions must be incorporated into this configuration, which results in additional cost and size to the circuit.

Moreover, transistor 204 is fully ON until its gate voltage reaches the turn-OFF threshold voltage. In order to turn OFF, the gate capacitance of transistor 204 needs to be fully discharged. Until the gate voltage reduces to below the MOS threshold voltage, transistor 204 stays ON. If this turn-OFF time is long, the current $I_L$ 222 begins to flow in the reverse direction from the load causing a significant power loss to the circuit. One possible way to avoid this reverse current is by increasing the MOS threshold voltage. However, this would cause the turn ON delay time of the synchronous rectifier or transistor 204 to increase, thereby degrading efficiency.

With regard to the other components illustrated in the circuit of FIG. 2, it is noted that as the node Lx goes low, NPN transistor 210 begins conducting due to its base-emitter junction becoming forward biased. Since PMOS transistor 208 is in a current mirror configuration with MOS transistor 206, a current proportional to the current in PMOS transistor 208 will conduct through PMOS transistor 206. The magnitude of the current through MOS transistor 206 will depend upon the (W/L) size ratios of PMOS transistors 206 and 208. The current conducting through PMOS transistor 206 creates a voltage across the resistor 216. When the voltage across resistor 216 increases to a MOS threshold voltage above Lx potential, the rectifier device or transistor 204 begins conducting, thus clamping node Lx to a voltage below ground while recirculating the current remaining in inductor 212.

Thus, as is clear from the foregoing, known prior art for driving transistors as synchronous rectifiers or "active" diodes has significant drawbacks. Accordingly, there is a need for a device that can eliminate the foregoing problems and limitations associated with the prior art devices.

SUMMARY OF THE INVENTION

In view of the foregoing, it is an objective of this invention to provide an active diode circuit, for use, for example, in replacing a synchronous rectifier, that overcomes the problems associated with prior art designs.

In accordance with one embodiment of the present invention, there is provided an active diode which includes a transistor having a source terminal, a drain terminal, a gate terminal and a back gate terminal, where the source terminal is connected to the back gate terminal. The circuit further includes an offset bias voltage source having a first terminal and a second terminal; and an operational amplifier having a non-inverting input terminal and an inverting input terminal, and an output terminal, where the inverting input terminal is connected to the drain terminal of the transistor, the non-inverting input terminal is connected to the first terminal of the offset bias source, the output terminal is connected to the gate terminal of the transistor, and the second terminal of the offset bias source is connected to the source terminal of the transistor. Further, the operational amplifier has an offset voltage, and the offset bias voltage source is set at a voltage level exceeding the offset voltage of the operational amplifier.

The active diode of the present invention provides numerous advantages over the prior art devices including, for example, a reduction in power dissipation, prevention of shoot-through current and the avoidance of undesired reverse current.

Additional advantages, and novel features of the invention will become apparent to those skilled in the art upon examination of the following description and accompanying drawings.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein. Like numbers refer to like elements throughout.

Figure 1A:
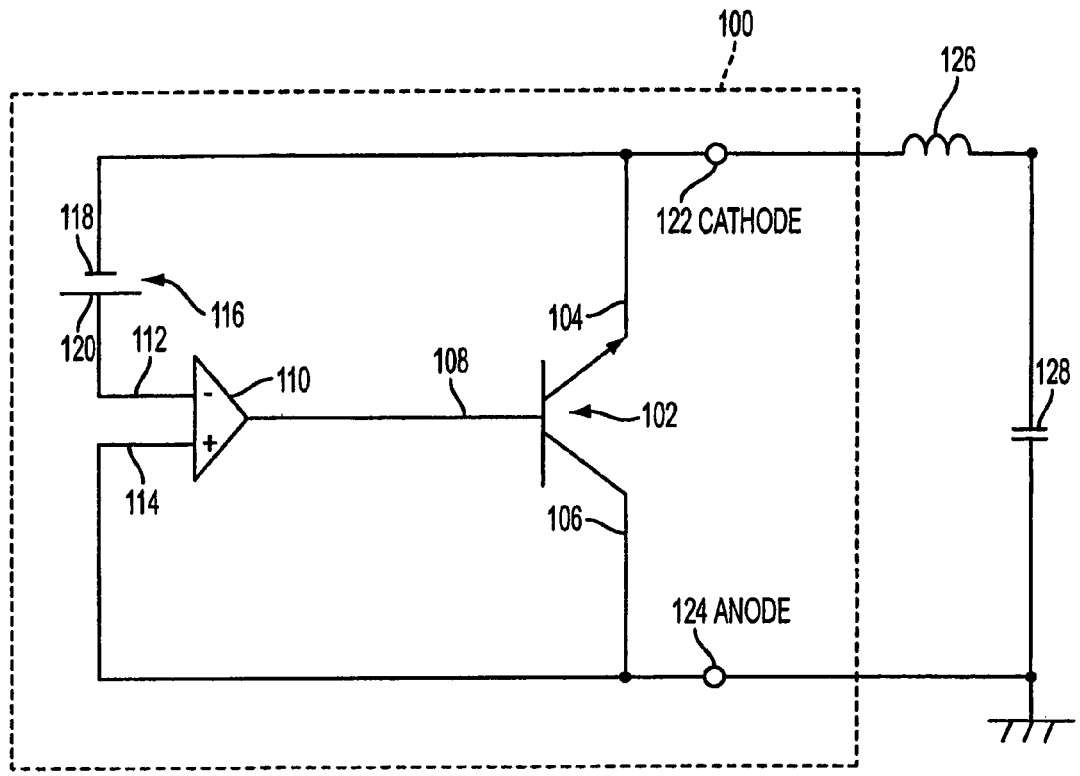
FIG. 1(a) illustrates a first prior art synchronous rectifier (active diode) circuit.
Figure 2:
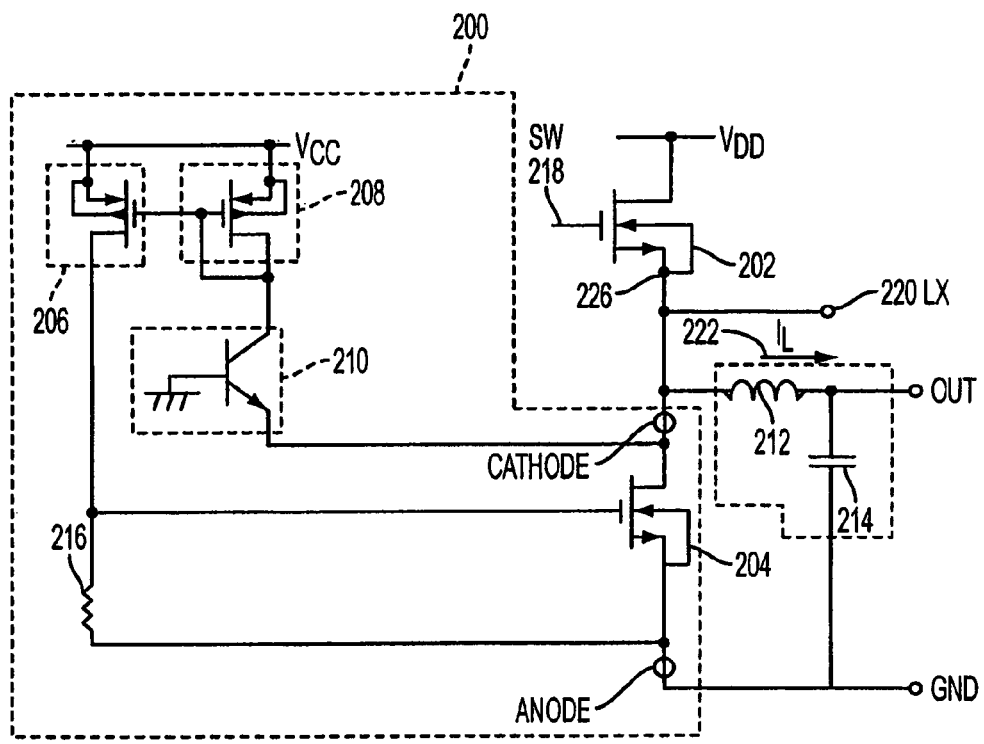
FIG. 2 illustrates a second prior art synchronous rectifier (active diode) circuit.
Figure 1B:
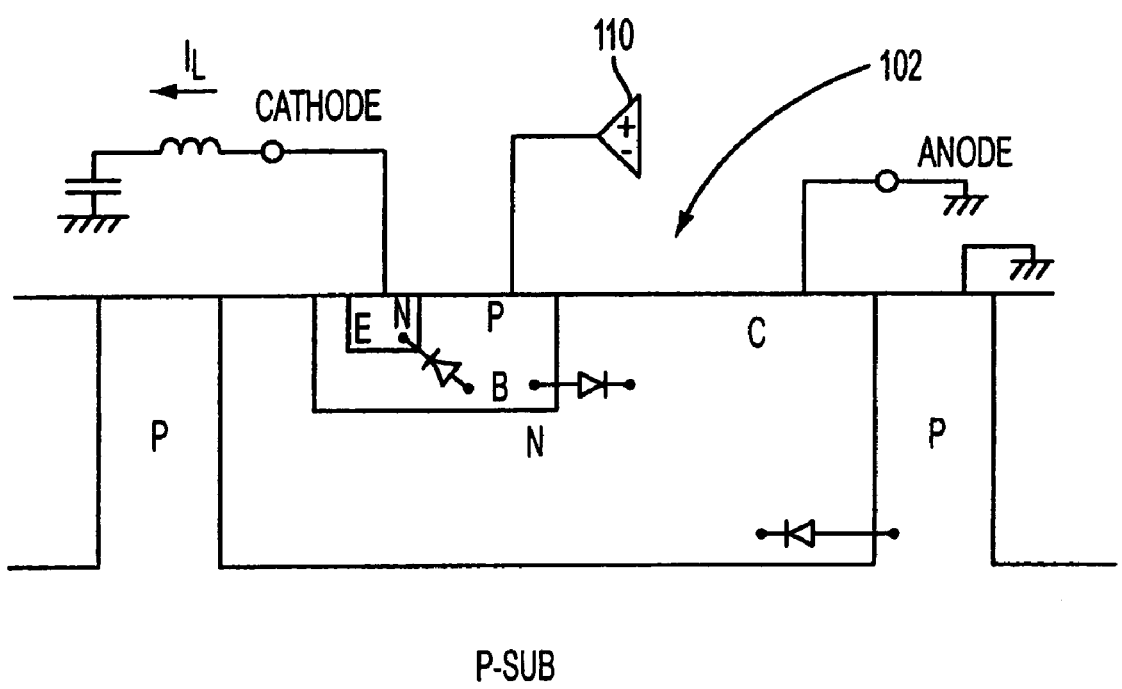
FIG. 1(b) illustrates the various junctions formed by the bipolar junction transistor utilized in the synchronous rectifier disclosed in FIG. 1(a).
Figure 3:
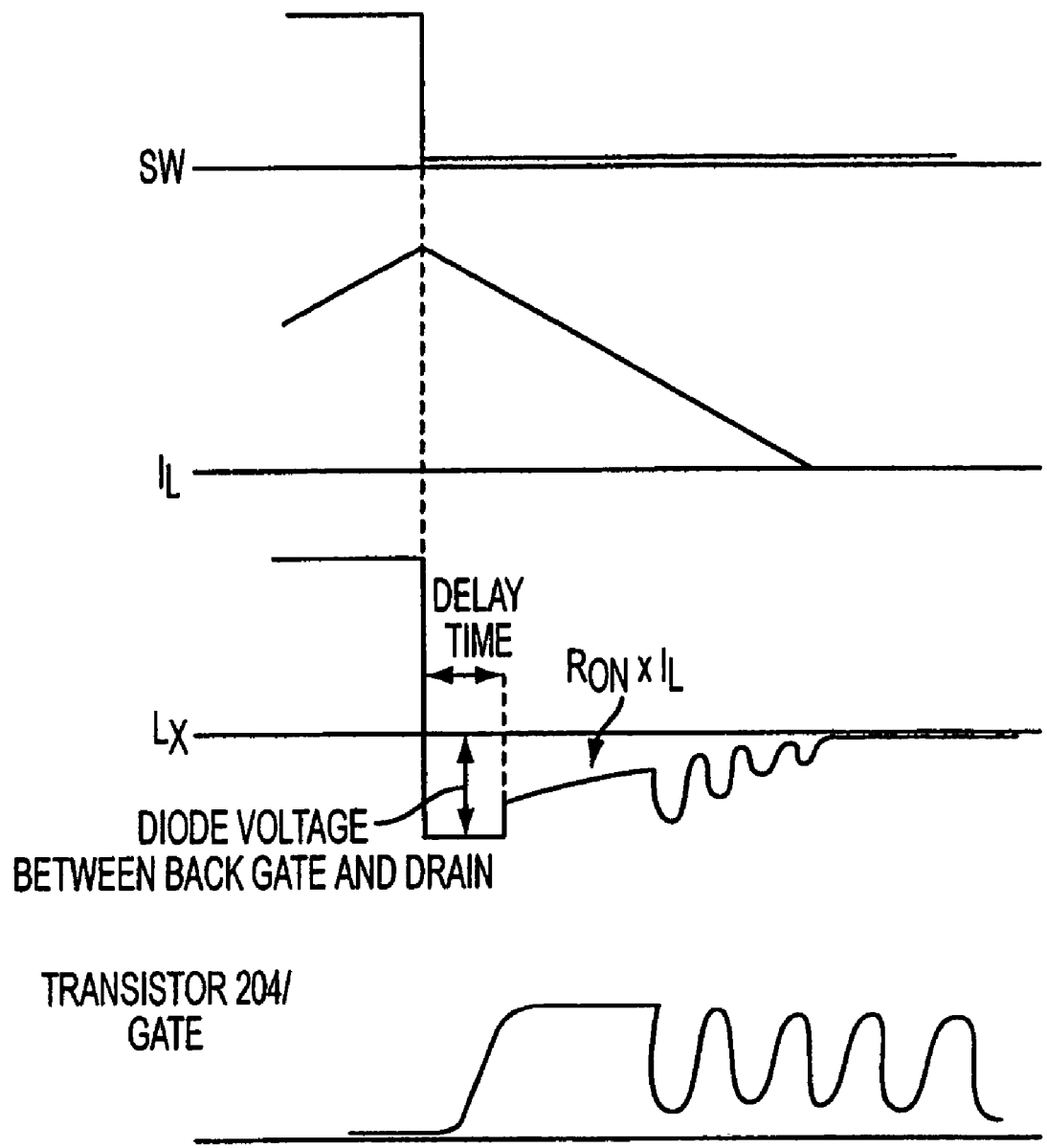
FIG. 3 illustrates a timing chart associated with the operation of prior art synchronous rectifier circuit shown in FIG. 2.
Figure 4:
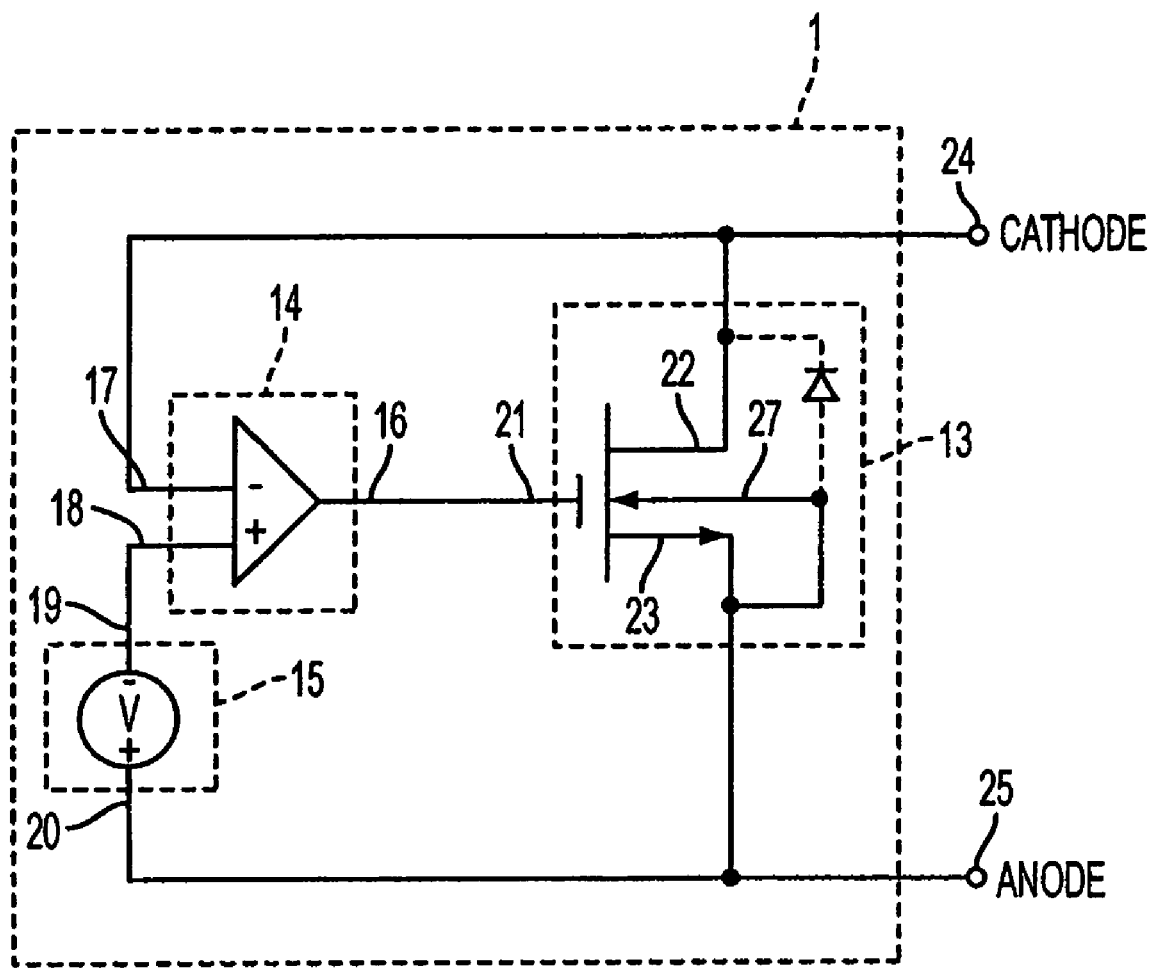
FIG. 4 illustrates an exemplary circuit schematic of a first embodiment of an active diode of the present invention.

FIG. 4 illustrates an exemplary circuit schematic of a first embodiment of the active diode circuit 1 of the present invention. Referring to FIG. 4, the active diode includes a NMOS transistor 13, an operational amplifier 14, an offset bias element 15, a cathode terminal 24 and an anode terminal 25. Specifically, the drain terminal 22 of the NMOS transistor 13 is connected to the cathode terminal 24, while the source terminal 23 and the back gate terminal 27 (i.e., the body of the NMOS) of the NMOS transistor 13 are coupled to the anode terminal 25 and the source terminal 23, respectively. The operational amplifier 14 has an inverting input terminal 17, which is connected to the cathode terminal 24, and a non-inverting input terminal 18 which is connected to the anode terminal 25 via the offset bias element 15. The output terminal 16 of the operational amplifier 14 is connected to the gate terminal 21 of the NMOS transistor 13. The offset bias element 15 preferably includes a first terminal 19 connected to the non-inverting input 18 of the operational amplifier 14 and a second terminal 20 connected to the anode terminal 25. It is noted that the back gate terminal 27 and drain terminal 22 of NMOS transistor 13 inherently form a PN junction, and as a result, provide a junction diode across this connection. This inherent PN junction diode is shown in hatched lines in the figures. It is further noted that although a NMOS transistor is used in the given embodiment, it should be understood that a PMOS transistor can also be utilized, as discussed further below.

The operation of the active diode 1 in accordance with the present invention is now described. In general, the active diode 1 operates in two primary states, the ON state (i.e., NMOS 13 is ON and conducting current from the anode to the cathode terminals) and the OFF state (i.e., NMOS 13 is OFF and preventing current flow between the cathode and anode terminals).

More specifically, when $V_{CA}$ ($V_{cathode}-V_{anode}$) falls below $V_{offset}$($V_{19}-V_{20}$, the offset bias voltage), negative feedback becomes active as the operational amplifier 14 responds to its input voltage and generates an output signal which causes NMOS transistor 13 to conduct. Because there is a small response delay time to turn ON the NMOS 13 transistor, this delay becomes the dead time of active diode 1. As such, it is preferable that a high bandwidth operational amplifier and a fast response MOSFET be utilized in the present invention so as to keep this delay time minimal. Furthermore, the inherent diode formed between the back gate 27 and the drain 22 of the NMOS 13 conducts current during the transient time of NMOS transistor 13 turn ON, and the transient voltage between the cathode terminal 24 and the anode terminal 25 is clamped by the back gate to drain diode.

It is noted that in the conventional (synchronously switched) prior art devices, to avoid shoot-through current, there is a short dead time during which each MOSFET is OFF. However, as a result of the circuit of the present invention, unlike the known prior art devices, such dead time is not necessarily required to prevent shoot-through current. This is due to the fact that because active diode 1 turns ON only when $V_{CA}$ falls below $V_{offset}$, the high side driver (which is not shown in FIG. 4, but would be coupled to active diode 1 in a typical configuration) has already turned OFF, thereby preventing shoot-through current.

Furthermore, during this delay time, as noted above, the active diode 1 allows for recirculation current to flow via the inherent back gate and drain diode of NMOS transistor 13. As a result, $V_{CA}$ does not become exceedingly negative as the transient voltage between the cathode and anode is clamped by the inherent back gate to drain diode, thereby preventing break down without utilizing any additional device.

When voltage $V_{CA}$ exceeds $V_{offset}$, the back gate to drain diode is already nonconducting and the NMOS 13 turns OFF again, and as a result there is no recirculation current. Thus, the active diode of the present invention advantageously prevents a reverse current condition from occurring.

It is noted that during the operation of the active diode of the present invention it is important that the reverse current condition be prevented from occurring. This is accomplished by setting $V_{offset}$ such that the NMOS 13 cannot turn on when $V_{CA}$ is a positive value.

A method for setting the offset voltage, $V_{offset}$, of offset bias element 15 to ensure the reverse current condition (which also causes NMOS 13 gate to be over driven to saturation, delaying turn OFF) does not occur during operation will now be described. It is first noted that $V_{ampoffset}$ corresponds to the offset voltage of the operation amplifier 14. The voltage has a defined tolerance, which means the amplifier offset can vary from $V_{ampoffset}$ (max) to $V_{ampoffset}$ (min). As noted above, $V_{offset}$ is the voltage of the offset bias means 15. The $V_{offset}$ voltage also has a defined tolerance which means the voltage can vary from $V_{offset}$ (max) to $V_{offset}$ (min).

The following definitions are applicable to the embodiment illustrated in FIG. 4 and the following discussion. $V_{CA} = V_{cathode} - V_{anode}$, $V_{offset} = V_{19} - V_{20}$, and $V_{ampoffset} = (V+)-(V-)$. In order to maintain negative feedback (i.e., prevent positive feedback, which causes reverse current to flow from the cathode to anode), $V_{CA}$ must remain negative:

$$V_{CA}(\max) < 0 \quad (1)$$

However, in the configuration shown in FIG. 4:

$$V_{CA}(\max) = V_{offset}(\max) - V_{ampoffset}(\min) \quad (2)$$

Once $V_{ampoffset}$ is determined from the operational amplifier's specifications, the value of $V_{offset}$ can be readily determined from equation (3), which is derived from equations (1) and (2):

$$V_{offset}(\max) - V_{ampoffset}(\min) < \quad (3)$$

Thus, according to the equation (3) above, by setting the maximum offset voltage value $V_{offset}$ (max) of offset bias element 15 to be less than the minimum amplifier offset voltage value $V_{ampoffset}$ (min) of operational amplifier 14, reverse current flow can be prevented.

As noted above, during operation, NMOS transistor 13 conducts when the voltage $V_{CA}$ of the cathode terminal 24 with respect to the anode terminal 25 falls just below the voltage $V_{offset}$ of the offset bias element 15. This condition is given by equation (4):

$$V_{CA} = V_{cathode} - V_{anode} = V_{offset} - V_{ampoffset} < 0 \quad (4)$$

Condition (1) of Table 1 illustrates the condition where $V_{ampoffset} = 0$. In this condition, when the voltage $V_{CA}$ of the cathode terminal 24 with respect to the anode terminal 25 goes to less than $-V_{offset}$, NMOS 13 is forward biased and begins conducting current.

TABLE 1

| Condition | (1) | (2) | (3) |
|---|---|---|---|
| Voltage of Offset Bias Element 15 | $V_{offset}$ | $V_{offset}$ | 0 |
| Offset Voltage of Operational Amplifier 14 | 0 | $V_{ampoffset}$ | $V_{ampoffset}$ |
| Voltage across cathode 24 to anode 25 terminals | $V_{offset}$ | $V_{offset} - V_{ampoffset}$ | $-V_{ampoffset}$ |

However, if operational amplifier 14 inherently has a slight amount of offset voltage, and assuming it has a negative amplifier offset voltage $V_{ampoffset}$, and the offset bias element 15 is omitted from the circuit, the NMOS transistor 13 becomes active with a voltage given by equation (5).

$$0 < V(\text{cathode}) - V(\text{anode}) = -V_{ampoffset} \quad (5)$$

Condition (3) of Table 1 demonstrates this condition. In this case, due to the omission of the offset bias element 15, it is possible for the NMOS 13 to conduct when $V_{CA}$ is positive, which would result in a reverse current flowing. Thus, as noted above, condition (3) usually should be avoided during operation.

It is noted that the voltage of the offset bias element 15 is not required to be a large magnitude as long as it is larger in magnitude than the magnitude of the amplifier offset voltage $V_{ampoffset}$ of the operational amplifier 14, and is generally in the range of about 10 mV.

Condition (2) of Table 1 illustrates the scenario where the voltage of the offset bias element 15 and the amplifier offset voltage $V_{ampoffset}$ of the operational amplifier 14 are set at $V_{offset}$ and $V_{ampoffset}$, respectively. Condition (2) represents the most likely condition of the actual device. As such, as noted above, $V_{offset}$ (max) of offset bias element 15 must be less than the minimum amplifier offset voltage value $V_{ampoffset}$ (min) of operational amplifier 14 to prevent reverse current flow. It is further noted that the offset bias element 15 could be of any means such as voltage, current or device mismatching within the operational amplifier 14, and not just an external voltage as described in the given embodiment. Also this offset bias element 15 can be placed on either the non-inverting or inverting input of operational amplifier 14.

The active diode can be utilized in numerous devices, including for example, in a buck switching regulator or a boost switching regulator. The operation of the active diode will be explained in more detail below in conjunction with the use of the active diode in both a buck and boost configuration.

Figure 5A:
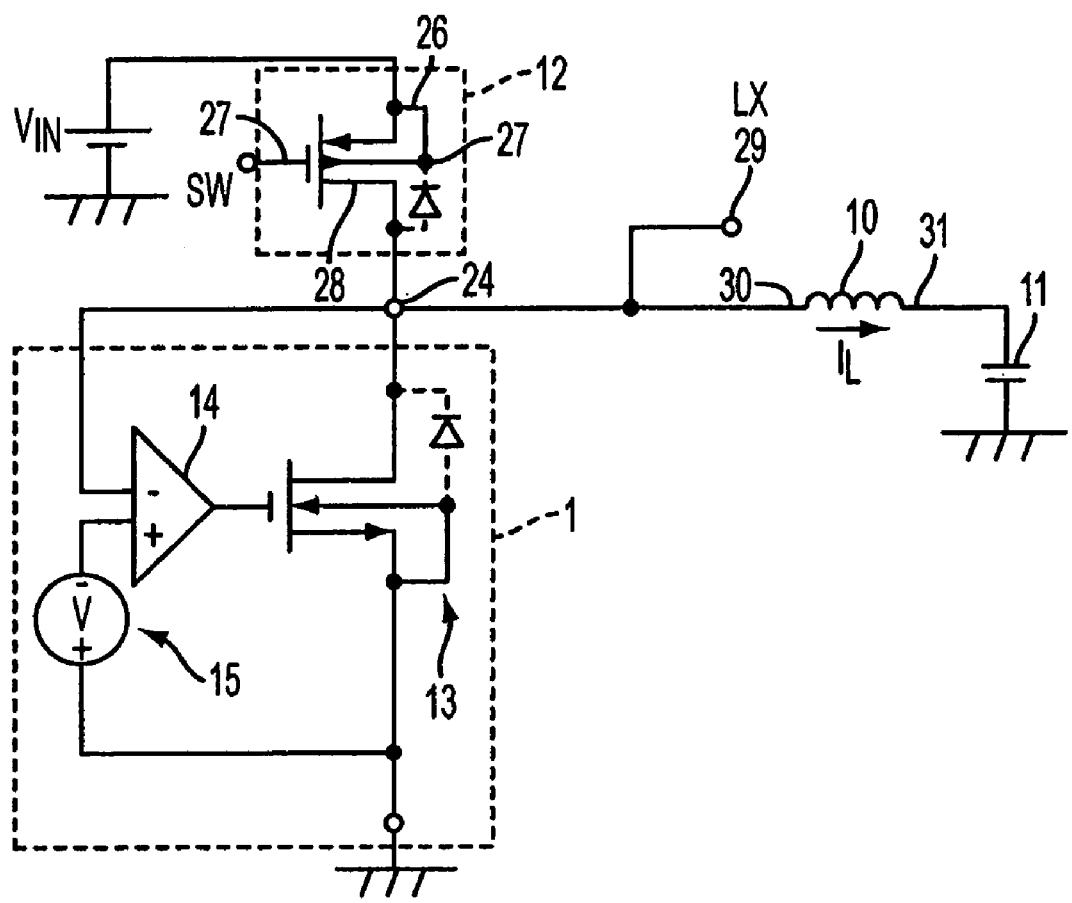
FIG. 5(a) illustrates an exemplary circuit schematic for using the active diode of the present invention in a buck switching regulator configuration.

FIG. 5(a) illustrates an exemplary circuit schematic for using the active diode circuit according to the first embodiment of the present invention utilized in a buck switching regulator configuration. Referring to FIG. 5(a), this buck configuration comprises the active diode 1, high side driver or transistor 12, an inductive load or inductor 10, capacitive load 11, LX terminal 29 and input voltage $V_{IN}$. The input voltage $V_{IN}$ is provided via conventional means such as, but not limited to, a battery or DC power source. The input voltage $V_{IN}$ is coupled to the source 26 of PMOS transistor 12. The drain 28 of PMOS transistor 12 is connected to the cathode terminal 24 of active diode 1. The back gate 27 is connected to the source 26. It should be readily apparent that a back gate and drain diode, which is shown in FIG. 5(a) in dotted lines, is inherently formed by this connection. The PMOS transistor 12 is controlled by the input signal SW. The LX terminal 29 is connected to one side 30 of the inductor 10 and high side driver PMOS transistor 12 drain, while capacitor 11 is connected to the other side 31 of the inductor 10.

A description of operation of the buck configuration will now be described. Generally speaking, the active diode 1 operates to sense the voltage LX at the terminal 29 and switches ON and OFF in accordance with variations in the voltage LX. It is noted that the voltage of the offset bias element 15 is preferably a small magnitude, while the LX voltage is controlled to a slightly negative voltage by a negative feedback loop so as to reduce power loss. As noted above, taking manufacturing variations in production into consideration, the voltage of the offset bias element 15 cannot be closer to zero than the inherit most negative amplifier offset voltage of the operational amplifier 14.

Figure 6:
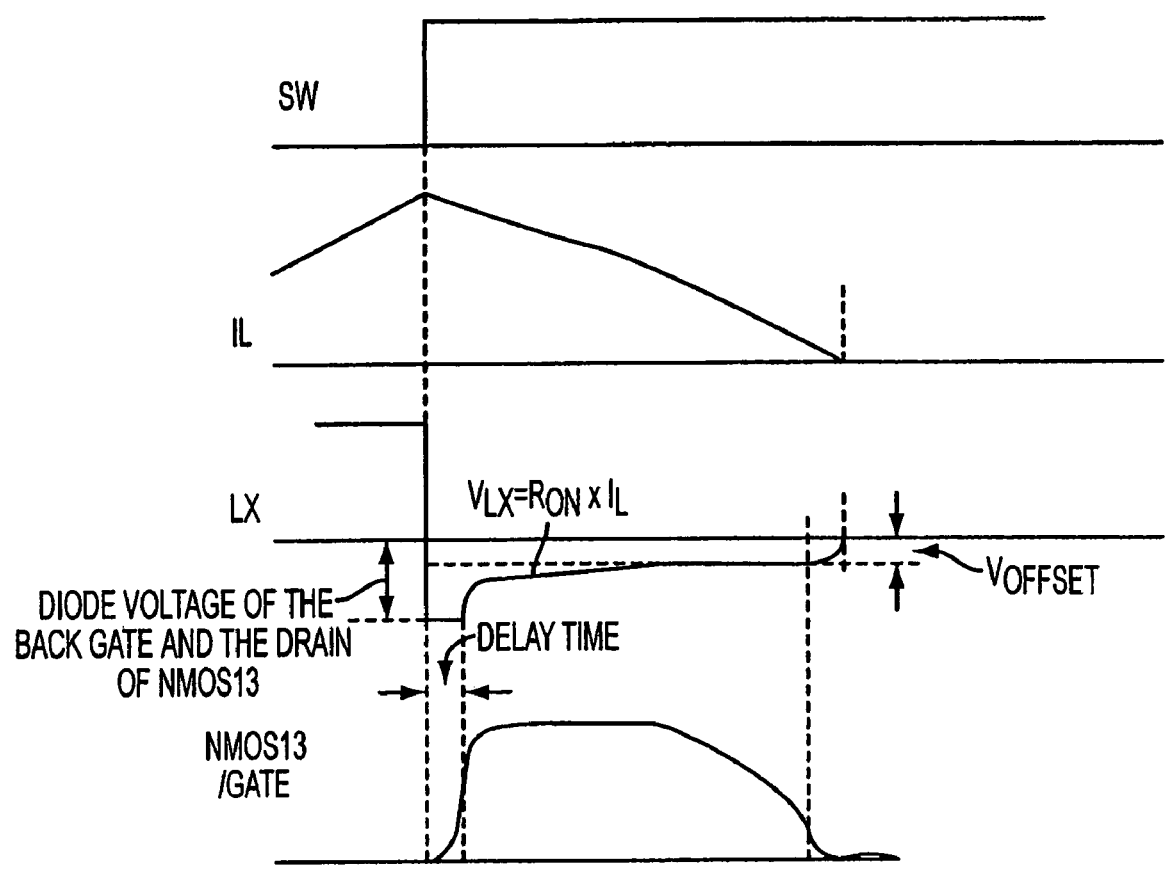
FIG. 6 illustrates an exemplary timing chart according to the buck configuration of FIG. 5(a).

FIG. 6 illustrates an exemplary timing chart according to the buck configuration of the first embodiment of the present invention. Referring to FIG. 5(a) and FIG. 6, when the voltage signal SW goes high, the PMOS transistor 12 turns OFF, and current $I_L$ flows in the inductor 10. Consequently, the voltage $V_{LX}$ of the LX output terminal 29 goes negative due to the current $I_L$. As soon as voltage $V_{LX}$ falls to below $V_{offset}-V_{ampoffset}$, operational amplifier 14, which senses the voltage $V_{LX}$, generates a positive output signal and turns ON NMOS transistor 13. Because there is a small delay time associated with turning ON the NMOS 13 transistor, this delay becomes the dead time of active diode 1. However, $V_{LX}$ is clamped by the back gate and drain diode of NMOS 13 during this time.

Moreover, it is again noted that as a result of the circuit of the present invention, unlike the conventional devices, dead time is not necessarily required to prevent shoot-through current. Specifically, because active diode 1 turns ON only when $V_{LX}$ falls below $V_{offset}-V_{ampoffset}$, the high side driver or transistor 12 has already turned OFF, thereby preventing the possibility of shoot-through current.

During this delay time, current $I_L$ is recirculated by the inherent back gate and drain diode of NMOS transistor 13. As a result, $V_{LX}$ does not become exceedingly negative, thereby preventing break down without utilizing any additional device. When recirculation current $I_L$ is relatively high, the gate voltage of transistor 13 is fully ON. This condition is given by:

$$R_{ON}(\text{ON resistance of NMOS transistor 13}) \times I_L > \text{mag.} \quad [V_{offset}-V_{ampoffset}] \quad (7)$$

This foregoing condition allows NMOS transistor 13 to be fully ON. As the recirculation current $I_L$ decreases according to the time constant of the inductor 10, the gate voltage of the NMOS transistor 13 decreases by negative feedback control of the operational amplifier 14 until:

$$V_{LX}=V_{offset}-V_{ampoffset} \quad (8)$$

When voltage $V_{LX}$ at the LX terminal 29 exceeds $V_{offset}-V_{ampoffset}$, NMOS 13 and the recirculation current $I_L$ turn OFF, as defined by:

$$V_{LX} \geq V_{offset}-V_{ampoffset} \quad (9)$$

This condition prevents reverse current, thereby allowing the present invention to realize an active diode function. This active diode improves efficiency by reducing dead time and eliminating reverse current.

Figure 5B:
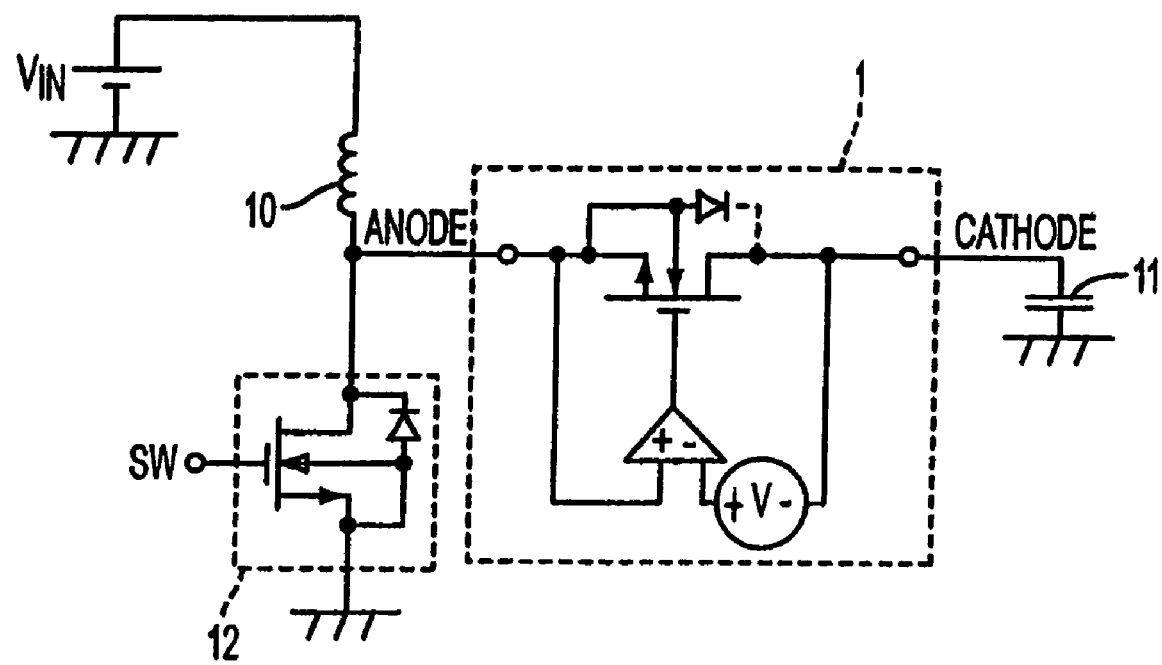
FIG. 5(b) illustrates an exemplary circuit schematic for using the active diode of the present invention in a boost switching regulator configuration.

FIG. 5(b) illustrates an exemplary circuit schematic for using the active diode circuit according to the first embodiment of the present invention in a boost switching regulator configuration. Since the operation of the active diode within the boost configuration is substantially similar to the operation of buck configuration described above, a further explanation of the boost configuration will be omitted.

Figure 7:
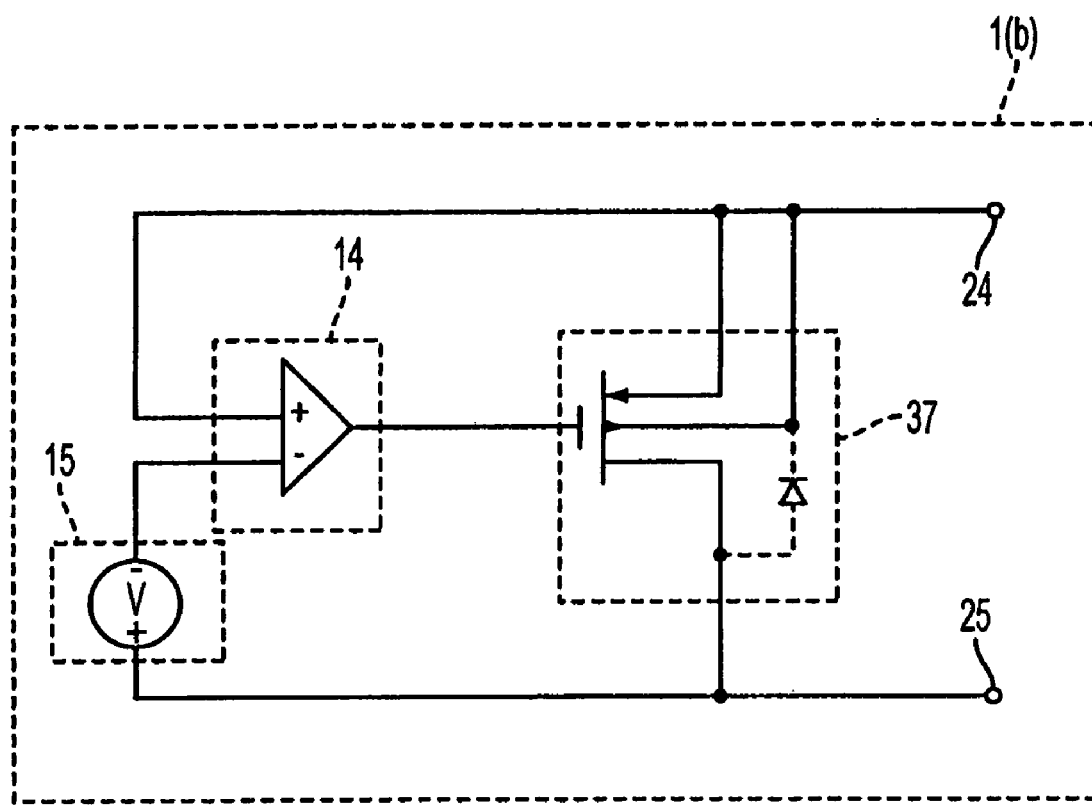
FIG. 7 an exemplary circuit schematic of a second embodiment of the active diode circuit of the present invention.

FIG. 7 depicts an exemplary circuit schematic in accordance with a second embodiment of the present invention. In contrast to the first embodiment, a PMOS transistor 37 is utilized in the active diode, as compared to the NMOS transistor 13 used in the first embodiment as shown in FIG. 4. Referring to FIG. 7, it is shown that in this embodiment, the source and back gate of the PMOS transistor 37 remain coupled to one another, however, the source and back gate of the transistor now form the cathode terminal of the active diode. The drain of the PMOS transistor, which still forms an inherent diode with the back gate, forms the anode terminal of the active diode. In addition, the cathode terminal of the device is fedback to the non-inverting input of the operation amplifier 14, while the anode terminal is fedback to the inverting input of the operational amplifier 14 via the offset bias means 15. The operation of the second embodiment of the active diode is essentially the same as discussed above in conjunction with first embodiment.

Figure 8A:
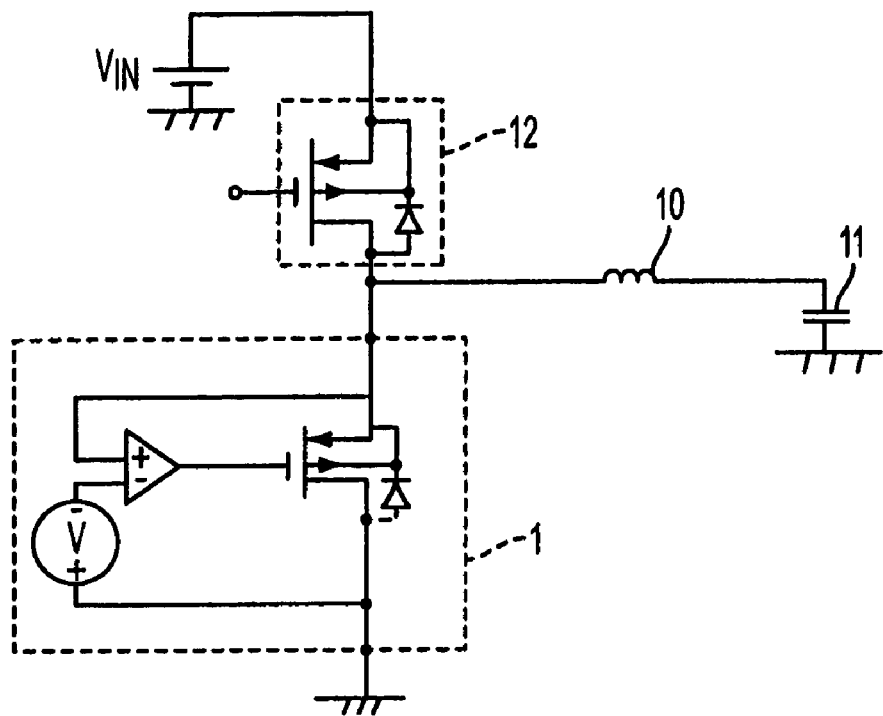
FIG. 8(a) illustrates an exemplary circuit schematic utilizing the active diode of the present invention according to the second embodiment in a buck switching regulator configuration.
Figure 8B:
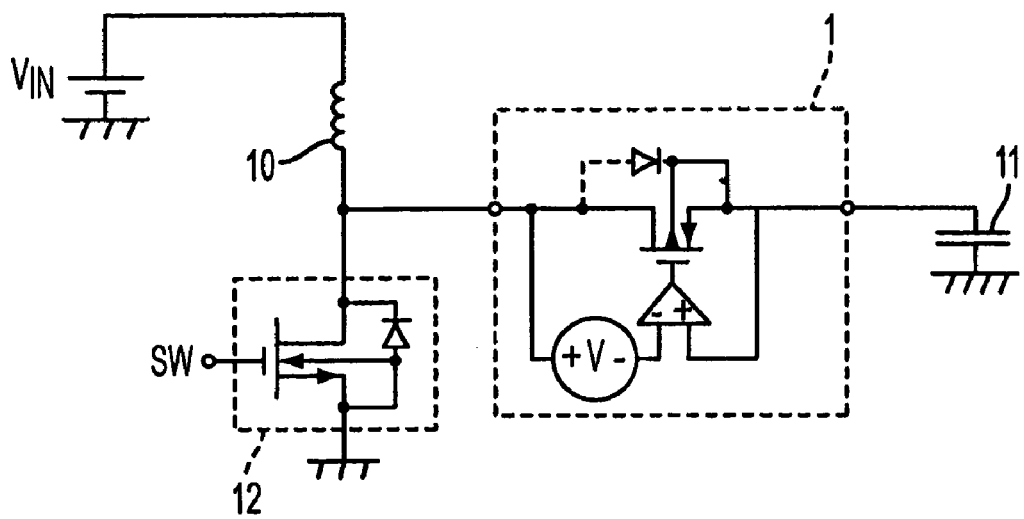
FIG. 8(b) illustrates an exemplary circuit schematic utilizing the active diode of the present invention according to the second embodiment in a boost switching regulator configuration.

FIG. 8(a) illustrates an exemplary circuit schematic for using the active diode circuit according to the second embodiment of the present invention in a buck switching regulator configuration while FIG. 8(b) displays illustrates an exemplary circuit schematic for using the active diode circuit according to the second embodiment of the present invention in a boost switching regulator configuration.

Figure 9:
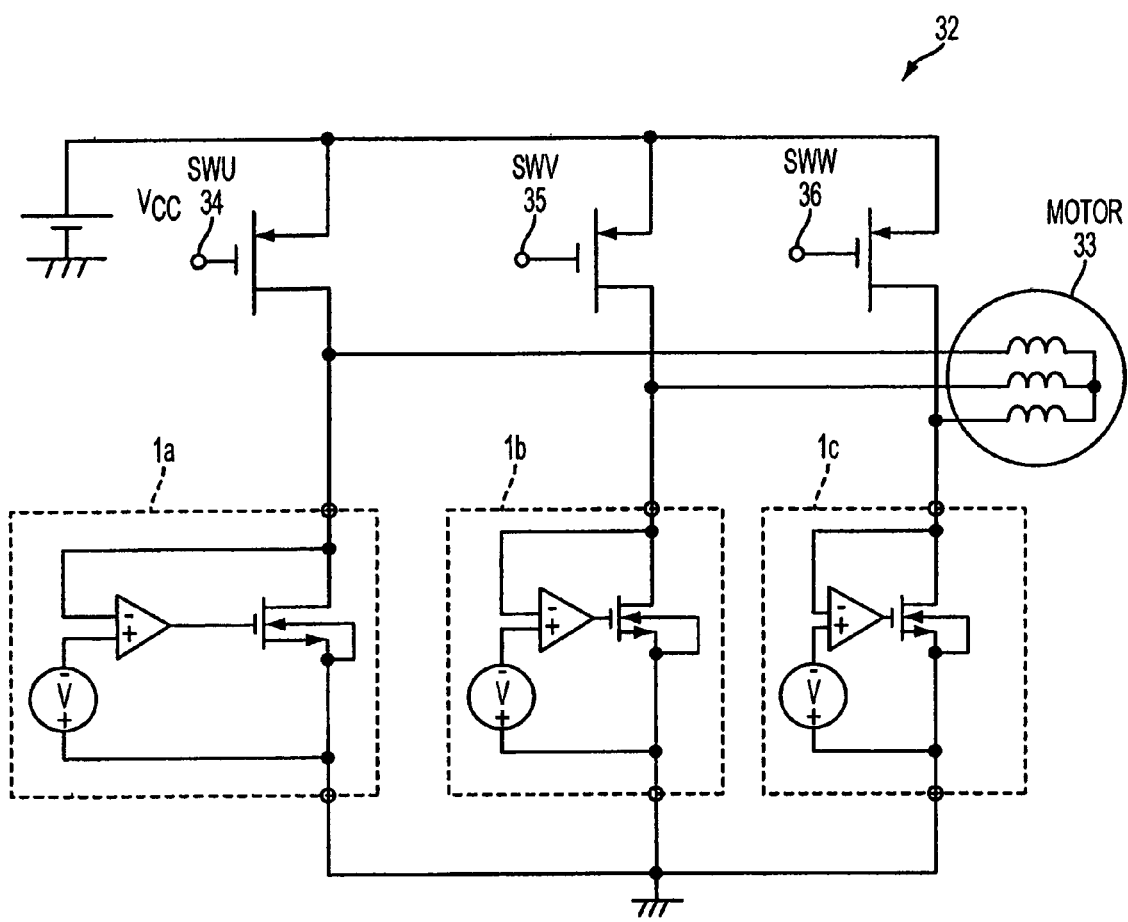
FIG. 9 is an exemplary circuit schematic of a 3 phase motor drive incorporating the first embodiment of the invention.

FIG. 9 is an exemplary circuit schematic of a three phase motor drive incorporating the first embodiment of the invention. In this embodiment, the motor drive circuit 32 utilizes three active diode circuits 1 with each coupled to a different high side switch, namely, SWU 34, SWV 35 and SWW 36. The anode terminal of each active diode circuit is connected to ground, and the cathode terminal of each active diode circuit is coupled to a different winding forming the three phase motor 33. It is noted that the low side drivers are not shown here. In the usual configuration, the operational amplifier of the active diode has a current source or resistive pull down and active pull up output stage which can be wire OR'ed with an open drain PMOS device that turns on the selected ones of the 3 NMOS as low side driver. Of course, the active diode circuit of the present invention can be utilized in numerous devices and configurations, and is not limited to the specific examples disclosed herein.

It is noted that variations of the foregoing embodiments are also possible. For example, while the active diode of the present invention has been illustrated utilizing NMOS and PMOS transistors, any other suitable transistor may be utilized, for example, but not limited to DMOS transistors.

One skilled in the relevant art will recognize, however, that the present invention can be practiced without one or more of the specific details, or with other methods, circuits, components, etc. In other instances, well-known diagrams and flow charts are not shown or described in detail to avoid obscuring aspects of various embodiments of the invention. While the above description contains many specifics, the readers should not construe these as limitations on the scope of the invention, but merely as exemplifications of preferred embodiments thereof. Those skilled in the art will envision many other possible variations are within its scope. It will be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An active diode comprising:
    a NMOS transistor having a source terminal, a drain terminal, a gate terminal and a back gate terminal, said source terminal being connected to said back gate terminal; said source terminal forming an anode terminal of said active diode, and said drain terminal forming a cathode terminal of said active diode;
    an offset bias voltage source having a first terminal and a second terminal; and
    an amplifier having a non-inverting input terminal and an inverting input terminal, and an output terminal, said inverting input terminal being connected to said drain terminal of said NMOS transistor, said non-inverting input terminal being connected to said first terminal of said offset bias voltage source, and said output terminal being connected to the gate terminal of the NMOS transistor;

wherein said second terminal of said offset bias voltage source is connected to said source terminal of said NMOS transistor, and said amplifier provides the sole control signal to said gate terminal of said NMOS transistor.

2. The active diode of claim 1, wherein said offset bias voltage source has a voltage level such that said NMOS transistor turns ON only when said voltage at said cathode terminal with respect to said anode terminal is less than 0 volts.

3. The active diode of claim 1, wherein the voltage between said cathode terminal and said anode terminal is maintained at the voltage of said offset bias voltage source plus an input offset bias voltage of said amplifier when forward current flows from said anode terminal to said cathode terminal.

4. The active diode of claim 1, wherein said amplifier is an operational amplifier.

5. The active diode of claim 1 wherein said amplifier has an input offset voltage, said offset bias voltage source being set at a voltage level exceeding the magnitude of said input offset voltage of said amplifier.

6. The active diode of claim 1, wherein said amplifier senses the voltage difference between said cathode terminal and said anode terminal and generates an output signal in accordance with the voltage difference between said cathode terminal and said anode terminal.

7. The active diode of claim 1, wherein current is conducted through said NMOS transistor in only a single direction.

8. An active diode comprising:
a PMOS transistor having a source terminal, a drain terminal, a gate terminal and a back gate terminal, said source terminal being connected to said back gate terminal; said source terminal forming a cathode terminal of said active diode, and said drain terminal forming an anode terminal of said active diode;
an offset bias voltage source having a first terminal and a second terminal; and
an amplifier having a non-inverting input terminal and an inverting input terminal, and an output terminal, said non-inverting input terminal being connected to said source terminal of said PMOS transistor, said inverting input terminal being connected to said first terminal of said offset bias voltage source, and said output terminal being connected to the gate terminal of said PMOS transistor;

wherein said second terminal of said offset bias voltage source is connected to said drain terminal of said PMOS transistor, and said amplifier provides the sole control signal to said gate terminal of said PMOS transistor.

9. The active diode of claim 8, wherein said offset bias voltage source has a voltage level such that said PMOS transistor turns ON only when said voltage at said cathode terminal with respect to said anode terminal is less than 0 volts.

10. The active diode of claim 8, wherein the voltage between said cathode terminal and said anode terminal is maintained at the voltage of said offset bias voltage source minus an input offset bias voltage of said amplifier when forward current flows from said anode terminal to said cathode terminal.

11. The active diode of claim 8, wherein said amplifier is an operational amplifier.

12. The active diode of claim 8, wherein said amplifier has an input offset voltage, said offset bias voltage source being set at a voltage level exceeding the magnitude of said input offset voltage of said amplifier.

13. The active diode of claim 8, wherein said amplifier senses the voltage difference between said cathode terminal and said anode terminal and generates an output signal in accordance with the voltage difference between said cathode terminal and said anode terminal.

14. The active diode of claim 8, wherein current is conducted through said PMOS transistor in only a single direction.

15. An active diode comprising:
a transistor having a source terminal, a drain terminal, a gate terminal and a back gate terminal, said source terminal being connected to said back gate terminal;
an offset bias voltage source having a first terminal and a second terminal; and
an amplifier having a non-inverting input terminal and an inverting input terminal, and an output terminal, said inverting input terminal being connected to said drain terminal of said transistor, said non-inverting input terminal being connected to said first terminal of said offset bias voltage source, and said output terminal being connected to the gate terminal of the transistor;
wherein said second terminal of said offset bias voltage source is connected to said source terminal of said transistor, and said amplifier provides the sole control signal to said gate terminal of said transistor.

16. The active diode of claim 15, wherein said offset bias voltage source has a voltage level such that said transistor turns ON only when said voltage at said cathode terminal with respect to said anode terminal is less than 0 volts.

17. The active diode of claim 15, wherein said amplifier is an operational amplifier.

18. The active diode of claim 15, wherein said amplifier has an input offset voltage, said offset bias voltage source being set at a voltage level exceeding the magnitude of said input offset voltage of said amplifier.

19. The active diode of claim 15, wherein said amplifier senses the voltage difference between a cathode terminal of said active diode and an anode terminal of said active diode and generates an output signal in accordance with the voltage difference between said cathode terminal and said anode terminal.

20. The active diode of claim 15, wherein current is conducted through said transistor in only a single direction.

21. A buck switching regulator comprising;
a common terminal;
an input terminal for supplying a direct current input from a power supply;
an output terminal;
an active diode having an anode terminal connected to the common terminal;
an inductor having a first terminal connected to a cathode terminal of the active diode and a second terminal connected to said output terminal;
a capacitor having first terminal connected to the output terminal and a second terminal connected to the common terminal; and a switching transistor connected between the input terminal and the first terminal of the inductor, and can carry out switching control according to a regulation control signal;

wherein the active diode comprises:
- a NMOS transistor having a source terminal, a drain terminal, a gate terminal and a back gate terminal, said source terminal being connected to said back gate terminal, said source terminal forming said anode terminal of said active diode, and said drain terminal forming said cathode terminal of said active diode;
- an offset bias voltage source having a first terminal and second terminal, wherein said second terminal is connected to said source terminal of said NMOS transistor; and
- an amplifier having a non-inverting input terminal and an inverting input terminal, and an output terminal, said inverting input terminal being connected said drain terminal of said NMOS transistor, said non-inverting input terminal being connected to said first terminal of said offset bias voltage source, and said output terminal being connected to the gate terminal of the NMOS transistor, said amplifier provides the sole control signal to said gate terminal of said NMOS transistor.

22. A buck switching regulator comprising;

a common terminal;

an input terminal for supplying a direct current input from a power supply;

an output terminal;

an active diode having a anode terminal connected to the common terminal;

an inductor having a first terminal connected to a cathode terminal of the active diode and a second terminal connected the output terminal;

a capacitor having first terminal connected to the output terminal and a second terminal connected to the common terminal; and a switching transistor connected between the input terminal and the first terminal of the inductor, and can carry out switching control according to a regulation control signal;

wherein the active diode comprises:
- a PMOS transistor having a source terminal, a drain terminal, a gate terminal and a back gate terminal, said source terminal being connected to said back gate terminal, said drain terminal forming said anode terminal of said active diode, and said source terminal forming said cathode terminal of said active diode;
- an offset bias voltage source having a first terminal and second terminal, wherein said second terminal is connected to said drain terminal of said PMOS transistor; and
- an amplifier having a non-inverting input terminal and an inverting input terminal, and an output terminal, said non-inverting input terminal being connected said source terminal of said PMOS transistor, said inverting input terminal being connected to said first terminal of said offset bias voltage source, and said output terminal being connected to the gate terminal of the PMOS transistor, and said amplifier provides the sole control signal to said gate terminal of said PMOS transistor.

23. A boost switching regulator comprising;

a common terminal;

an input terminal for supplying a direct current input from a power supply;

an output terminal;

an active diode having a cathode terminal connected to the output terminal;

an inductor having a first terminal connected to an anode terminal of the active diode and a second terminal connected the input terminal;

a capacitor having first terminal connected to the output terminal and a second terminal connected to the common terminal; and a switching transistor connected between the common terminal and the first terminal of the inductor, and can carry out switching control according to a regulation control signal;

wherein the active diode comprises:
- a PMOS transistor having a source terminal, a drain terminal, a gate terminal and a back gate terminal, said source terminal being connected to said back gate terminal, said drain terminal forming the anode terminal of said active diode, and said source terminal forming the cathode terminal of said active diode;
- an offset bias voltage source having a first terminal and second terminal, wherein said second terminal is connected to said drain terminal of said PMOS transistor; and
- an amplifier having a non-inverting input terminal and an inverting input terminal, and an output terminal, said non-inverting input terminal being connected said source terminal of said PMOS transistor, said inverting input terminal being connected to said first terminal of said offset bias voltage source, and said output terminal being connected to the gate terminal of the PMOS transistor, and said amplifier provides the sole control signal to said gate terminal of said PMOS transistor.

* * * * *

UNITED STATES PATENT AND TRADEMARK OFFICE
CERTIFICATE OF CORRECTION

| | |
|---|---|
| PATENT NO. | : 7,199,636 B2 |
| APPLICATION NO. | : 11/094369 |
| DATED | : April 3, 2007 |
| INVENTOR(S) | : Richard Oswald et al. |

It is certified that error appears in the above-identified patent and that said Letters Patent is hereby corrected as shown below:

On page 2 of the title page of the Letters Patent,

Under section "(56) References Cited, U.S. Patent Documents", change "6,873,140 B2 3/2005 Saginni et al. " to -- 6,873,140 B2  3/2005  Saggini et al. --, and Add omitted section -- Other Publication
 "Overview of Feedback Control For Converters", pp 600 – 606 --

Signed and Sealed this

Twenty-sixth Day of June, 2007

JON W. DUDAS
*Director of the United States Patent and Trademark Office*